United States Patent
Lee et al.

(10) Patent No.: US 10,667,412 B2
(45) Date of Patent: May 26, 2020

(54) PRINTED CIRCUIT BOARD ASSEMBLY AND STORAGE DEVICE

(71) Applicant: PHISON ELECTRONICS CORP., Miaoli (TW)

(72) Inventors: Chun-Feng Lee, Hsinchu (TW); Ming-Jen Cheng, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 15/955,688

(22) Filed: Apr. 18, 2018

(65) Prior Publication Data
US 2019/0281710 A1  Sep. 12, 2019

(30) Foreign Application Priority Data

Mar. 7, 2018  (TW) .............................. 107107761 A

(51) Int. Cl.
H05K 5/00 (2006.01)
H05K 1/11 (2006.01)
H05K 3/34 (2006.01)

(52) U.S. Cl.
CPC ........... H05K 5/0069 (2013.01); H05K 1/111 (2013.01); H05K 3/341 (2013.01)

(58) Field of Classification Search
CPC ................. H05K 3/3452; H05K 1/144; H01L 2924/3011; H01L 2224/48091
See application file for complete search history.

(56) References Cited

U.S. PATENT DOCUMENTS

| | | | | |
|---|---|---|---|---|
| 5,540,598 A | * | 7/1996 | Davis | H01R 12/724 439/79 |
| 5,586,008 A | * | 12/1996 | Kozel | H01R 12/7058 174/260 |
| 5,734,549 A | * | 3/1998 | Oura | G11B 33/10 361/679.37 |
| 5,740,020 A | * | 4/1998 | Palatov | G06F 1/18 361/736 |
| 6,409,523 B1 | * | 6/2002 | Shih | H01R 12/57 439/79 |
| 8,432,708 B2 | * | 4/2013 | Chen | G06F 1/26 361/679.31 |
| 9,942,993 B2 | * | 4/2018 | Thomson, Jr. | H05K 3/3447 |

(Continued)

FOREIGN PATENT DOCUMENTS

CN 104795387 7/2015

OTHER PUBLICATIONS

"Office Action of China Counterpart Application," dated Feb. 6, 2020, pp. 1-8.

*Primary Examiner* — Pete T Lee
(74) *Attorney, Agent, or Firm* — JCIPRNET

(57) ABSTRACT

A circuit board assembly including a circuit board and a connector is provided. The circuit board has a plate body, at least one electrical connecting hole, and at least one pad, wherein the pad and the electrical connecting hole are disposed on the plate body, the electrical connecting hole is located in a range of the pad, and the electrical connecting hole penetrates through the pad. The connector has at least one pin, wherein the connector is assembled to the circuit board, the pin is soldered onto the pad, and the pin covers the electrical connecting hole located in the range of the pad. A storage device is also disclosed.

26 Claims, 4 Drawing Sheets

(56) References Cited

U.S. PATENT DOCUMENTS

2008/0146051 A1* 6/2008 Honda ............... H01R 43/0256
439/66
2014/0102626 A1* 4/2014 Clayton ................ H05K 3/363
156/196

* cited by examiner

PRINTED CIRCUIT BOARD ASSEMBLY AND STORAGE DEVICE

CROSS-REFERENCE TO RELATED APPLICATION

This application claims the priority benefit of Taiwan application serial no. 107107761, filed on Mar. 7, 2018. The entirety of the above-mentioned patent application is hereby incorporated by reference herein and made a part of this specification.

BACKGROUND

Technical Field

The invention relates to a circuit board assembly and a storage device.

Description of Related Art

With advancement of technologies for manufacturing printed circuit boards (PCBs) and electronic components, in order to meet the demand for miniaturized electronic products, the printed circuit boards and the electronic components are tended to be designed with small sizes. However, reduction in the size of the printed circuit boards also means that a layout design of the printed circuit board and its assembly and collocation with the electronic components will become more difficult.

Generally, in the layout design of the printed circuit board, disposition of a pad matching a size of the electronic component is often used to couple (e.g., solder) the electronic components to the printed circuit board for an electrical connection with wiring layers of the printed circuit board. Meanwhile, with presence of through holes, the printed circuit board itself is used as a connection structure between different layers of the wiring layers and the pads or the electronic components. However, in the existing printed circuit board, to avoid mutual influence during soldering, a specific safe distance needs to be maintained between the through hole and the pad to prevent them from being too close to each other and causing an inflow of a soldering material into the through hole.

Moreover, as described above, with reduction in the size of the printed circuit board, the printed circuit board may face a problem where the safe distance cannot be maintained between the through hole and the pad due to the lack of enough structure area. Accordingly, finding a way to maintain the safe distance while meeting the demand for miniaturized electronic products is one of issues to be addressed by persons skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention provides a circuit board assembly in form of a thin structure and a storage device, which can meet soldering requirements for the circuit board assembly.

The circuit board assembly of the invention includes a circuit board and a connector. The circuit board has a plate body, at least one electrical connecting hole, and at least one pad. The electrical connecting hole is located in a range of the pad, and the electrical connecting hole penetrates through the pad. The connector has at least one pin. The connector is assembled to the circuit board, the pin is soldered onto the pad, and the pin covers the electrical connecting hole located in the range of the pad.

The storage device of the invention includes a circuit board, a connector, a memory module and a control circuit module. The circuit board has a plate body, at least one electrical connecting hole, and at least one pad. The electrical connecting hole is located in a range of the pad, and the electrical connecting hole penetrates through the pad. The connector has at least one pin. The connector is assembled to the circuit board, the pin is soldered onto the pad, and the pin covers the electrical connecting hole located in the range of the pad. The memory module and the control circuit module are respectively disposed on the circuit board. The memory module, the control circuit module and the connector are electrically connected to each other through a circuit of the circuit board and the pad.

Based on the above, in the circuit board assembly and the storage device using the same according to the embodiments of the invention, with the pads and the electrical connecting holes formed on the circuit board and the electrical connecting hole located in the range of the pad, the pin of the connector may cover the electrical connecting hole in the range of the pad later when the connector is assembled to the circuit board. In this way, during soldering, not only can the electrical connecting holes be covered by the pins to prevent the inflow of the soldering material, a disposition measure of having the electrical connecting hole located in the range of the pad may further improve a utilization rate for a surface area of the circuit board without restrictions.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
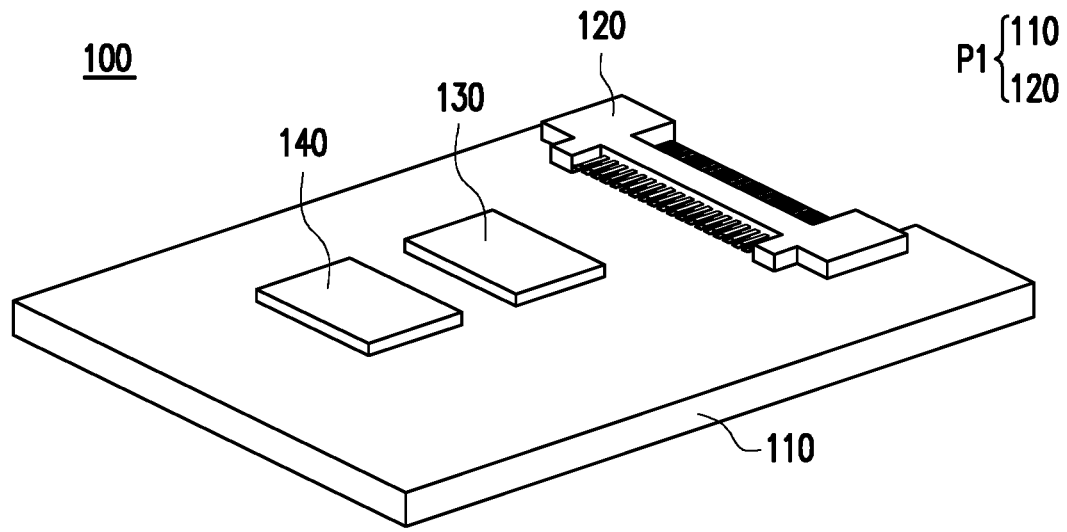
FIG. 1 is a schematic view of a storage device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Figure 2:
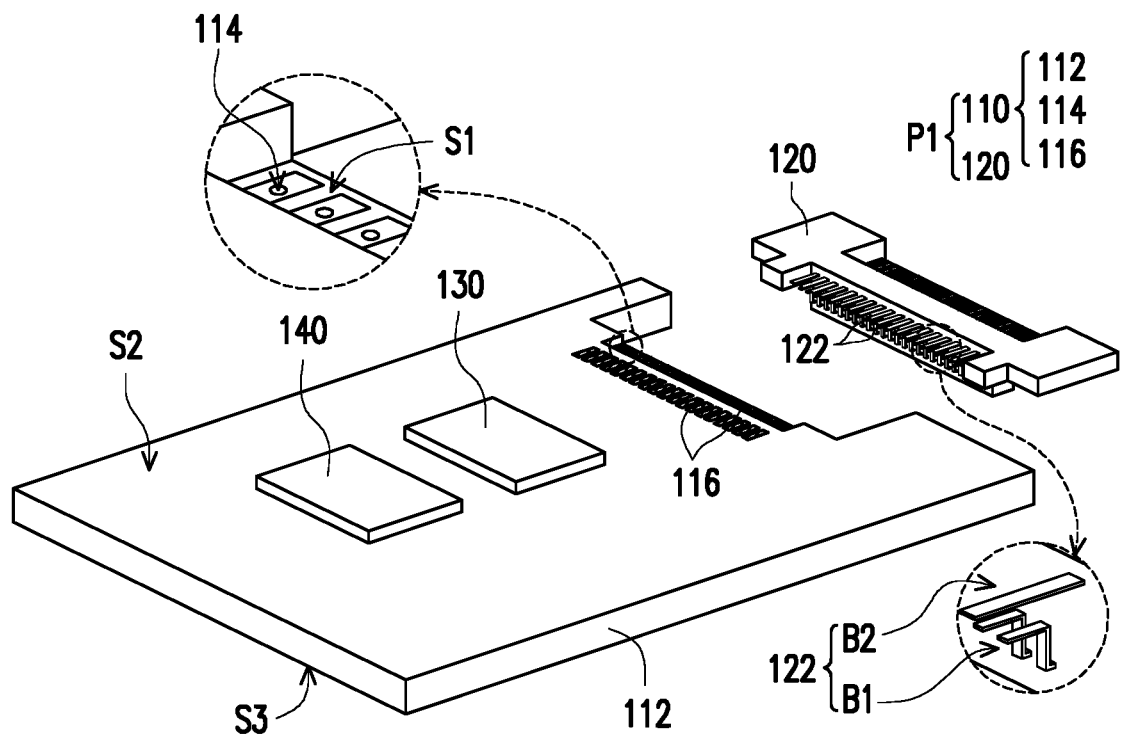
FIG. 2 is an explosion view of the storage device in FIG. 1.

FIG. 1 is a schematic view of a storage device according to an embodiment of the invention. FIG. 2 is an explosion view of the storage device in FIG. 1. Referring to FIG. 1 and FIG. 2 together, in this embodiment, a storage device 100 is, for example but not limed thereto, a rewritable non-volatile memory storage device (e.g., a pen drive, a memory card or a solid state drive (SSD)) which includes a circuit board 110, a connector 120, a memory module 130 and a control circuit module 140. Here, the circuit 110 and the connector 120 form a circuit board assembly P1 of this embodiment, which may be collocated with the memory module 130, the control circuit module 140 or other not-shown electronic components to form an electronic device with different functions.

Here, the circuit board 110 is, for example, a multi-layer circuit board having a plurality of wiring layers, and includes a plate body 112, an electrical connecting hole 114 and a pad 116. The electrical connecting hole 114 is disposed on the circuit board 112, and configured to electrically connect different layers in the plate body 112 or the wiring layers on its surface (details regarding the same will be described in more details in the following paragraphs). The pad 116 is disposed on a surface of the plate body 112, and configured to provide places for soldering with the connector 120, the memory module 130 and the control circuit module 140 to be electrically connected with the wiring layers disposed on the plate body 112. In this way, the connector 120, the memory module 130 and the control circuit module 140 may then be electrically connected to each other through a circuit formed by the pad 116 and the wiring layers of the circuit board 110.

Nonetheless, this embodiment is not intended to limit the measure for electrically connecting the memory module 130 and the control circuit module 140 with the wiring layers of the circuit board 110, which may vary based on different existing electronic component packages, packaging techniques or requirement conditions. An assembly relation between the connector 120 and the circuit board 110 is described in more details.

Figure 3:
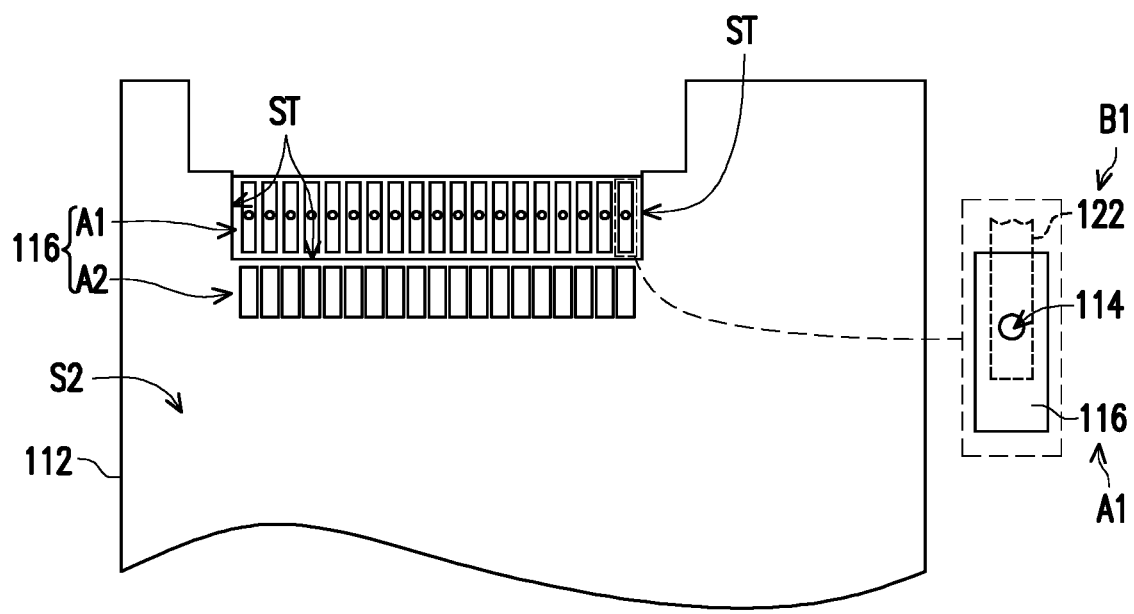
FIG. 3 is a partial top view of the circuit board in FIG. 2.

FIG. 3 is a partial top view of the circuit board in FIG. 2. Referring to the FIG. 2 and FIG. 3 together, in this embodiment, the plate body 112 of the circuit board 110 has a first surface S1, a second surface S2 and a third surface S3 which are different from but parallel to each other. In other words, when viewing the plate body 112 from a right viewing angle at FIG. 2, the second surface S2 is at the top, the third surface is at the bottom, and the first surface S1 is between the second surface S2 and the third surface S3. The pad 116 is substantially disposed on said three surfaces. However, as described above, only those related to the circuit board 110 and the connector 120 are described here, and the rest of pads are not illustrated, which can also be learnt from the prior art.

Specifically, for allowing the circuit board assembly P1 to meet a light and thin use requirement, a part of the circuit board 110 of this embodiment adopts a sinking structure as shown in FIG. 2, in which the first surface S1 is lower than the second surface S2, and is collocated with a plurality of pins 122 of the connector 120. Here, the pads 116 are grouped into a first pad group A1 and a second pad group A2 according to the first surface S1 and the second surface S2, and the pins 122 of the connector 120 are also grouped into a first pin group B1 and a second pin group B2 accordingly. In this way, the connector 120 may be assembled to the circuit board 110 by soldering the first pin group B1 onto the first pad group A1 and soldering the second pin group B2 onto the second pad group A2. Here, with respect to the connector 120, along its assembly path to the circuit board 110, a distance of the first pad group A1 relative to the connector 120 is smaller than a distance of the second pad group A2 relative to the connector 120. Therefore, as shown by a partial enlarged view in FIG. 2, the second pin group B2 of the connector 120 straightly extends to be soldered onto the second pad group A2, whereas the first pin group B1 sinks along the first surface S1 of the plate body 112 to be bent and extended into a Z-shape. Also, on aforesaid assembly path, a pin length of the second pin group B2 is greater than a pin length of the first pin group B1.

Furthermore, the electrical connecting holes 114 of the circuit board 110 are respectively disposed on the pads 116 of the first surface S1 (i.e., the first pad group A1), and configured to connect the first surface S1 and the third surface S3. It should be noted that, as described above, because the first surface S1 is the sinking structure relative to the second surface S2, the plate body 112 has a step ST between the first surface S1 and the second surface S2. The step ST surrounds three side edges of the first surface S1 such that a recess is provided on the plate body 112 where the connecter 120 is to be assembled when viewing from the top, as shown in FIG. 3. More specifically, it is given that the plate body 112 has no additional plate area on the first surface S1 for disposing the electrical connecting holes. That is to say, as shown in FIG. 2 and FIG. 3, in the first pad group A1, the pad located at a first place and located at a last place (the leftmost and the rightmost pad in the first pad group A1 shown in FIG. 3) is structurally substantially closely adjacent to the step ST. It also means that additional and enough area is not available for disposing the electrical connecting holes once the first pad group A1 is completely disposed on the first surface S1. On the other hand, because the second surface S2 of the plate body 112 has enough area, it is not required to dispose the electrical connecting hole in a range of the pad 116.

Based on the above, by disposing the electrical connecting holes 114 on the pads of the first pad group A1 in this embodiment, the different wiring layers of the circuit board 110 may be electrically connected to the pads 116 on the first surface S1 or the third surface S3 through the electrical connecting holes 114. As described above, so long as the circuit board has enough structure area, it is not required to dispose the electrical connecting hole in the range of the pad. Yet, as described in this embodiment, to achieve the light and thin effect, the first surface S1 of this embodiment needs to have a sinking contour so an overall thickness of the circuit board assembly P1 may be reduced. Therefore, it is required to dispose the electrical connecting hole 114 in the range of the pad of the first pad group A1. Here, the circuit board assembly P1 also needs to allow the first pin group B1 of the connector 120 to be soldered onto the first pad group A1 in order to cover the electrical connecting hole 114 in the range of the pad. Accordingly, a soldering action may be performed smoothly without fear of the inflow of the soldering material into the electrical connecting holes 114.

Referring back to FIG. 3, a correspondence relation between the pin 122 and the pad 116 is further described with reference to an example. In this embodiment, a size of the pin 122 shown in FIG. 3 is 0.25 mm×0.6 mm (=0.15 mm²), whereas a size of the pad 116 is 0.5 mm×1.5 mm (=0.75 mm²). Therefore, it is apparent that the pin 122 covers one-seventh of an area of the pad 116.

Figure 4:
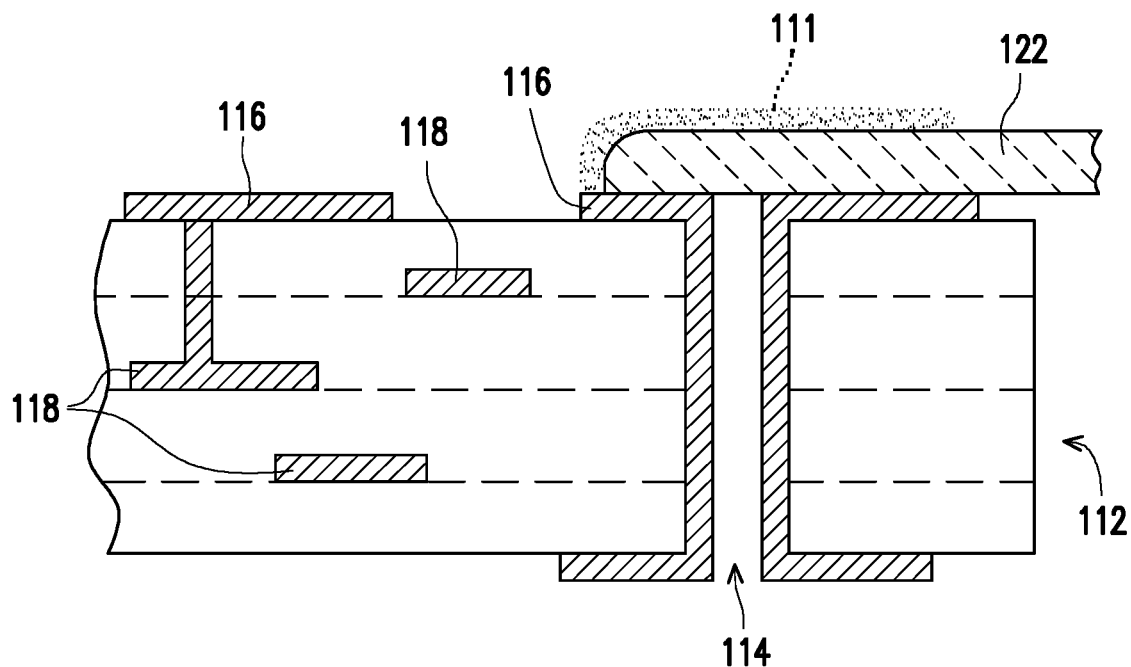
FIG. 4 is a partial cross-sectional view of the circuit board assembly in FIG. 1.

FIG. 4 is a partial cross-sectional view of the circuit board assembly in FIG. 1. Referring to FIG. 3 and FIG. 4, as described above, the circuit board 110 is a multi-layer circuit board having a plurality of wiring layers 118. Accordingly, the different wiring layers 118 may be electrically connected to each other through the electrical connecting hole 114. What is more, the electrical connecting hole 114 of FIG. 4 is a through hole penetrating the plate body 112 (of course, in other embodiment, the electrical connecting hole may also be a blind hole that partially penetrates the plate body 112). Meanwhile, as shown in FIG. 1 and FIG. 2, when the connecter 120 is assembled to the circuit board 110, the pins 122 of the first pin group B1 cover the pads 116 of the first pad group A1, and thus also cover (shield) the electrical connecting holes 114 in the range of the pad 116. Then, the pins 122 and the pads 116 are soldered together by a soldering material 111. Because the pins 122 already have the electrical connecting holes 114 covered, the soldering material 111 will not flow into the electrical connecting holes 114. In other words, once the electrical connecting holes 114 are covered by the pins 122 of the connector 120, apparently, the electrical connecting holes 114 will not be exposed on the circuit board assembly P1. More importantly, due to blocking of the pins 122 during soldering, the soldering material 111 may solder the pins 122 and the pads 116 together by a fixed amount without fear of inconsistent appearance caused by poor solder distribution. Therefore, the circuit board assembly P1 of this embodiment can still meet the inspection standard of IPC-610 Class 1/2/3.

Figure 5:
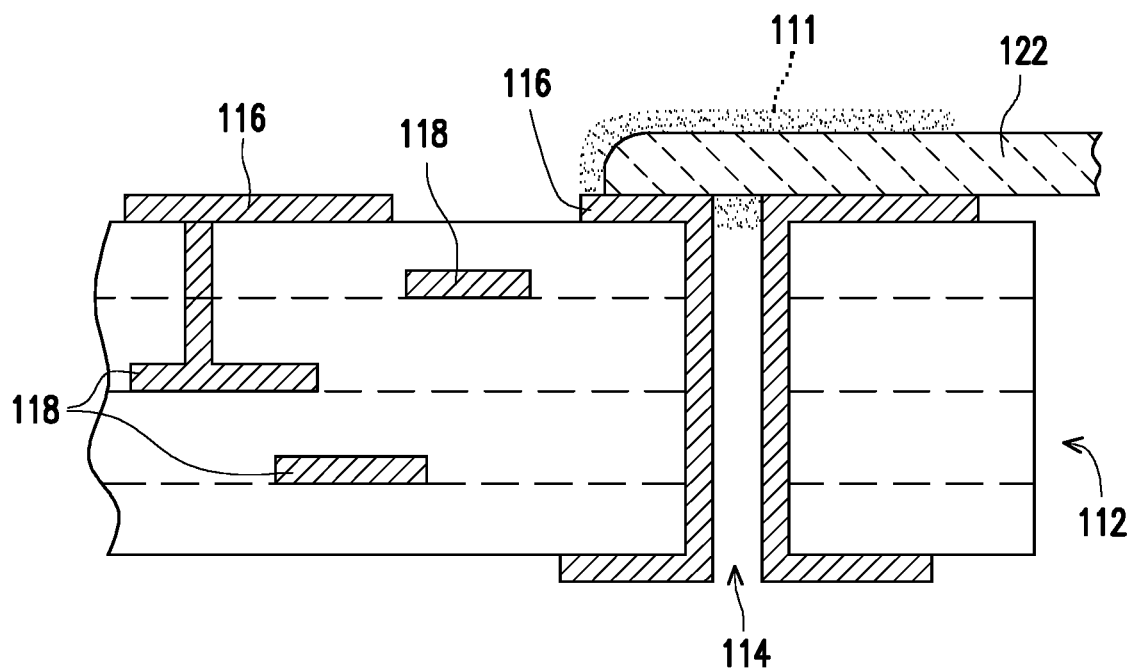
FIG. 5 and FIG. 6 are partial cross-sectional views of the circuit board assembly in other embodiments.
Figure 6:
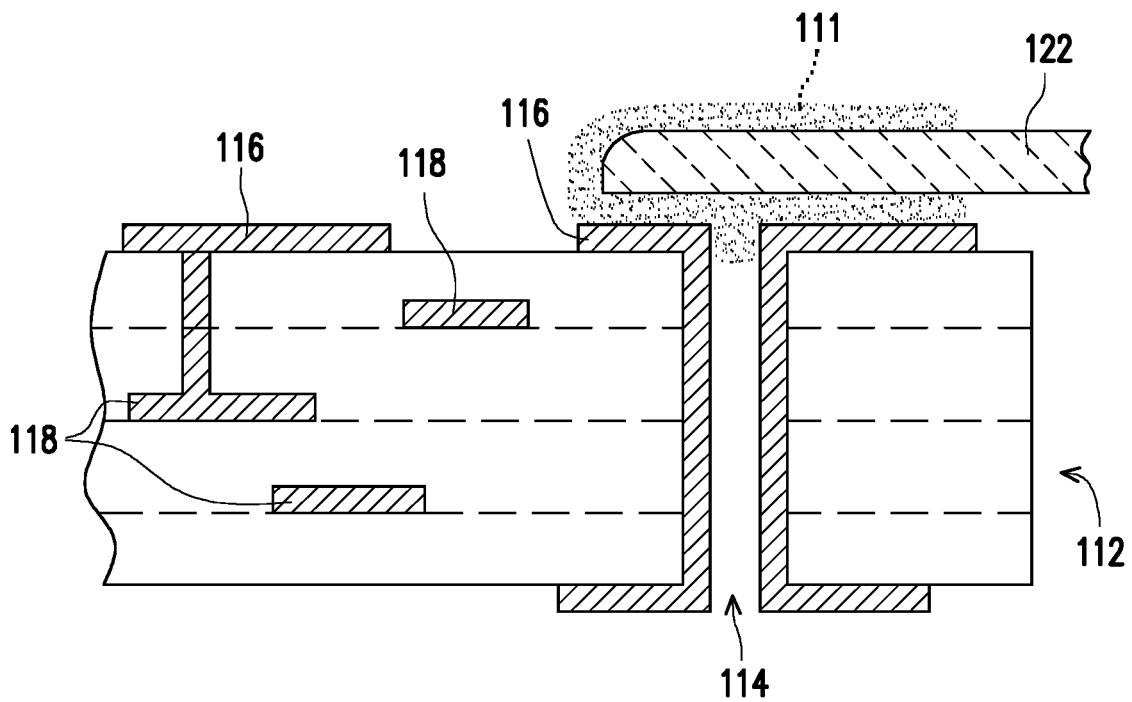

FIG. 5 and FIG. 6 are partial cross-sectional views of the circuit board assembly in other embodiments. Another soldering method is further provided as follows. With reference to FIG. 5, before soldering is performed on the circuit board 110 (i.e., before the pins 122 of the connector 120 overlay the pads 116), a small amount of the soldering material 111 is coated on the surface of the pad 116 in advance. Due to the influence of surface tension and viscosity, the soldering material may be filled in the electrical connecting holes 114 adjacent to the first surface S1 of the plate body 112, so as to provide a blocking effect for the electrical connecting holes 114. Afterwards, the soldering action is performed on the pins 122 and the pads 116 by using the soldering material 111, and a pressure is applied on the pins 122 to push out the soldering material 111 between the pins 122 and the pads 116 while keeping the soldering material filled at openings of the electrical connecting holes 114. Next, with reference to FIG. 6, there is another approach which does not provide said pressure. That is to say, the soldering material 111 between the pins 122 and the pads 116 still remains, so the electrical connecting holes 144 are still being covered.

In another not-illustrated embodiment, aforesaid action about filling the electrical connecting holes 114 in advance may also be done during a manufacturing process of the circuit board at the process of coating insulation printing ink. In other words, the electrical connecting hole may be filled with the insulation printing ink to achieve the same effect of filling the through hole.

Figure 7:
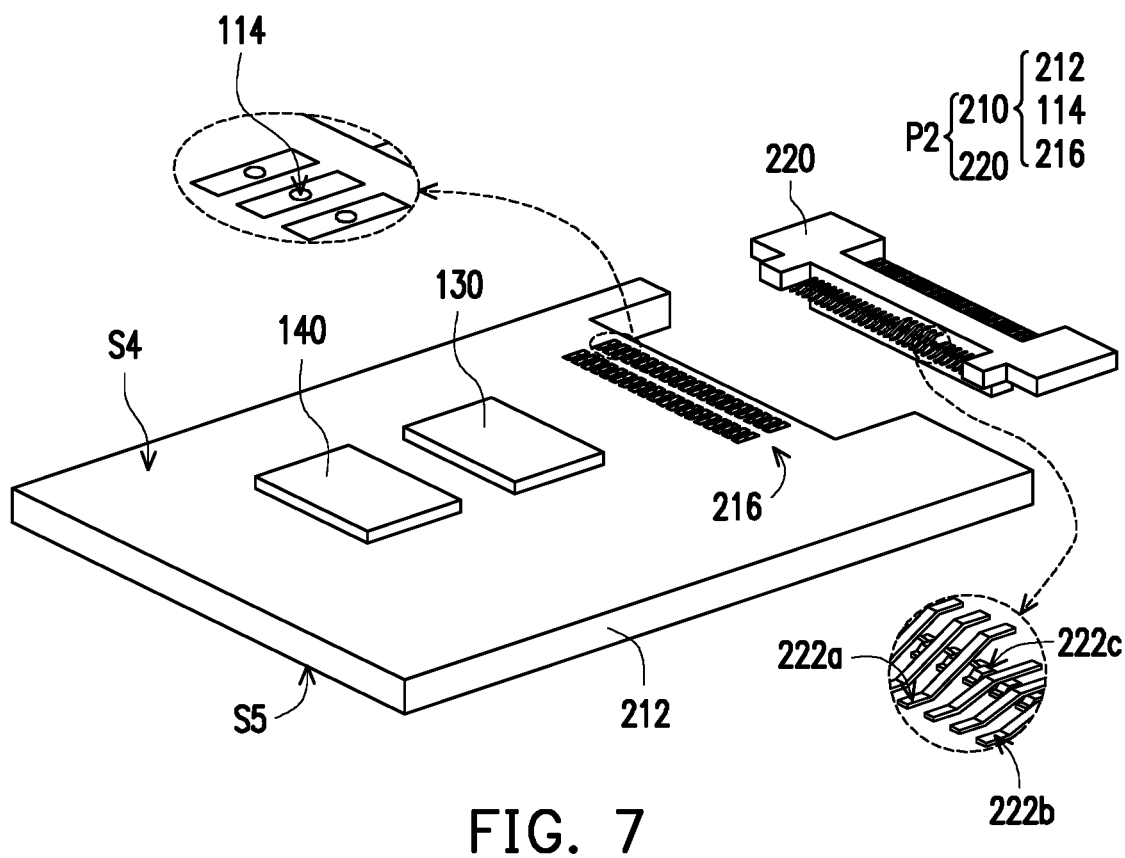
FIG. 7 is a schematic view of a storage device according to another embodiment of the invention.
Figure 8:
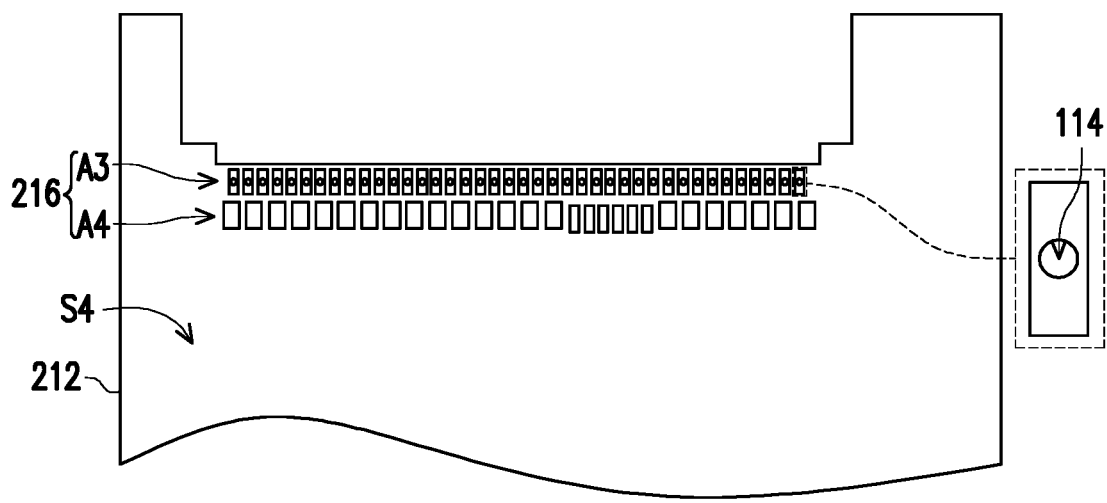
FIG. 8 is a partial top view of the circuit board in FIG. 7.

FIG. 7 is a schematic view of a storage device according to another embodiment of the invention. FIG. 8 is a partial top view of the circuit board in FIG. 7. Referring to FIG. 7 and FIG. 8 together, as similar to the foregoing embodiments, a circuit board assembly P2 includes a circuit board 210 and a connector 220, pads 216 are also grouped into a first pad group A3 and a second pad group A4, and the electrical connecting hole 114 is still located close to a range of the first pad group A3 of the connector 220. In other words, a distance of the pads 216 disposed with the electrical connecting holes 114 (i.e., the first pad group A3) relative to the connector 220 is smaller than a distance of the pads 216 not disposed with the electrical connecting holes 114 (i.e., the second pad group A4) relative to the connector 220. That is to say, the first pad group A3 disposed with the electrical connecting holes 114 is substantially located at a structure edge of a plate body 212, i.e., an edge of a recess shown in FIG. 7 and FIG. 8, and the second pad group A4 not disposed with the electrical connecting holes 114 is relatively away from the structure edge of the plate body 212.

In addition, unlike the foregoing embodiments, the first pad group A3 and the second group A4 are located on a same surface (i.e., a first surface S4), and the first surface S4 and a second surface S5 are two opposite surfaces of the plate body 212. Such configuration is used to make the pads 216 correspond to pins of the connector 220 as shown bin FIG. 7 where the connector 220 has pins 222a, 222b and 222c. Here, a length of the pin 222c is shorter than lengths of the pins 222a and 222b, and is configured to be soldered with the first pad group A3 to cover the electrical connecting hole 114. In spite of the difference in heights, lengths of orthogonally projections of the pins 222a and 222b on the plate body 212 are identical so the pins 222a and 222b can be soldered with the second pad group A4. Meanwhile, end portions of the pins 222a, 222b and 222c are located on the same plane to be corresponding to the first pad group A3 and the second pad group A4, which are located on the first surface S4.

To sum up, in the circuit board assembly and the storage device using the same according to the embodiments of the invention, with the pads and the through holes formed on the circuit board and the through hole located in the range of the pad, the pin of the connector may cover the through hole in the range of the pad later when the connector is assembled to the circuit board. In this way, during soldering, not only can the through holes be covered by the pins to prevent the inflow of the soldering material, the disposition measure of having the through hole located in the range of the pad may further improve the utilization rate for the surface area of the circuit board without restrictions.

More specifically, for allowing the storage device to meet the light and thin demand, it is required to correspondingly adjust the assembly relation between the circuit board and the connector. Accordingly, the invention adopts the sinking structure formed at a partial region of the circuit board where the connector is to be assembled (i.e., surfaces with different heights) so the pads to be soldered with the connector can be respectively disposed on said surfaces with different heights. Also, the pins of the connector are also correspondingly grouped into pins in double rows with different heights, which can be smoothly soldered onto the pads of the different surfaces. Nevertheless, the surface of the circuit board formed in the sinking structure by this approach will face the problem where there is not enough surface area for disposing the through holes. Therefore, when disposing the through holes and the pads on the surface being the sinking structure in the invention, each of the through holes is disposed in the range of the pad so the through holes can be covered by the pins when the connector is assembled to the circuit board.

As a result, the circuit board assembly and the storage device of the invention can have the light and thin appearance and meet the specifications required for the soldering process because of said structure.

The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit board assembly, comprising:
   a circuit board, comprising a plate body, at least one electrical connecting hole and at least one pad, wherein the pad and the electrical connecting hole are disposed on the plate body, the electrical connecting hole is located in a range of the pad, and the electrical connecting hole penetrates through the pad; and
   a connector having at least one pin, wherein the connector is assembled to the circuit board, the pin is soldered onto the pad, and the pin completely covers the electrical connecting hole located in the range of the pad without entering the electrical connecting hole.

2. The circuit board assembly of claim 1, wherein the circuit board is a multi-layer circuit board having a plurality of wiring layers, and different layers of the wiring layers are electrically connected to each other through the electrical connecting hole.

3. The circuit board assembly of claim 1, wherein the electrical connecting hole is a through hole penetrating the plate body.

4. The circuit board assembly of claim 1, wherein a soldering material is filled in the electrical connecting hole adjacent to a surface of the plate body.

5. The circuit board structure of claim 1, wherein a soldering material is provided between the pin and the pad to cover the electrical connecting hole.

6. The circuit board assembly of claim 1, wherein the circuit board has a plurality of pads and a plurality of electrical connecting holes, the electrical connecting holes are located on a part of the pads, and a distance of the pads disposed with the electrical connecting holes relative to the connector is smaller than a distance of the pads not disposed with the electrical connecting holes relative to the connector.

7. The circuit board assembly of claim 6, wherein the pads disposed with the electrical connecting holes are adjacent to an edge of the plate body, and the pads not disposed with the electrical connecting holes are away from the edge of the plate body.

8. The circuit board assembly of claim 6, wherein the plate body has a first surface and a second surface different from but parallel to each other, the circuit board has a plurality of pads respectively disposed on the first surface and the second surface, the connector has a plurality of pins respectively soldered onto the pads on the first surface and the pads on the second surface, and the pads disposed with the electrical connecting holes are located on the first surface.

9. The circuit board assembly of claim 8, wherein the plate body further comprises a third surface opposite to the second surface, the first surface, the second surface and the third surface are parallel to each other, the first surface is located between the second surface and the third surface, and the electrical connecting hole connects the first surface and the third surface.

10. The circuit board assembly of claim 8, wherein the plate body has a step between the first surface and the second surface, and the step surrounds three side edges of the first surface.

11. The circuit board assembly of claim 10, wherein among the pads on the first surface, the pad located at a first place or located at a last place is closely adjacent to the step.

12. The circuit board assembly of claim 6, wherein the pads are located on a same surface of the plate body.

13. The circuit board assembly of claim 1, wherein the pin covers one-seventh of an area of the pad.

14. A storage device, comprising:
   a circuit board, comprising a plate body, at least one electrical connecting hole and at least one pad, wherein the pad and the electrical connecting hole are disposed on the plate body, the electrical connecting hole is located in a range of the pad, and the electrical connecting hole penetrates through the pad;
   a connector having at least one pin, wherein the connector is assembled to the circuit board, the pin is soldered onto the pad, and the pin completely covers the electrical connecting hole located in the range of the pad without entering the electrical connecting hole; and
   a memory module and a control circuit module disposed on the circuit board, the memory module, the control circuit module and the connector are electrically connected to each other through a circuit of the circuit board and the pad.

15. The storage device of claim 14, wherein the circuit board is a multi-layer circuit board having a plurality of wiring layers, and different layers of the wiring layers are electrically connected to each other through the electrical connecting hole.

16. The storage device of claim 14, wherein the electrical connecting hole is a through hole penetrating the plate body.

17. The storage device of claim 14, wherein a soldering material is filled in the through hole adjacent to a surface of the plate body.

18. The storage device of claim 14, wherein a soldering material is provided between the pin and the pad to cover the electrical connecting hole.

19. The storage device of claim 14, wherein the circuit board has a plurality of pads and a plurality of electrical connecting holes, the electrical connecting holes are located on a part of the pads, and a distance of the pads disposed with the electrical connecting holes relative to the connector is smaller than a distance of the pads not disposed with the electrical connecting holes relative to the connector.

20. The storage device of claim 19, wherein the pads disposed with the electrical connecting holes are adjacent to an edge of the plate body, and the pads not disposed with the electrical connecting holes are away from the edge of the plate body.

21. The storage device of claim 19, wherein the plate body has a first surface and a second surface different from but parallel to each other, the circuit board has a plurality of pads respectively disposed on the first surface and the second surface, the connector has a plurality of pins respectively soldered onto the pads on the first surface and the pads on the second surface, and the pads disposed with the electrical connecting holes are located on the first surface.

22. The storage device of claim 21, wherein the plate body further comprises a third surface opposite to the second surface, the first surface, the second surface and the third surface are parallel to each other, the first surface is located between the second surface and the third surface, and the electrical connecting hole connects the first surface and the third surface.

23. The storage device of claim 21, wherein the plate body has a step between the first surface and the second surface, and the step surrounds three side edges of the first surface.

24. The storage device of claim 23, wherein among the pads on the first surface, the pad located at a first place or located at a last place is closely adjacent to the step.

25. The storage device of claim 19, wherein the pads are located on a same surface of the plate body.

26. The storage device of claim 14, wherein the pin covers one-seventh of an area of the pad.

* * * * *